(12) United States Patent
Takei

(10) Patent No.: US 9,244,878 B2
(45) Date of Patent: Jan. 26, 2016

(54) HANDHELD ELECTRONIC DEVICE AND DISPLAY METHOD FOR A HANDHELD ELECTRONIC DEVICE

(75) Inventor: Michiko Takei, Kanagawa (JP)

(73) Assignee: KYOCERA CORPORATION, Kyoto (JP)

( * ) Notice: Subject to any disclaimer, the term of this patent is extended or adjusted under 35 U.S.C. 154(b) by 105 days.

(21) Appl. No.: 13/392,704

(22) PCT Filed: Aug. 27, 2010

(86) PCT No.: PCT/JP2010/064585
§ 371 (c)(1),
(2), (4) Date: Feb. 27, 2012

(87) PCT Pub. No.: WO2011/024946
PCT Pub. Date: Mar. 3, 2011

(65) Prior Publication Data
US 2012/0154287 A1    Jun. 21, 2012

(30) Foreign Application Priority Data
Aug. 27, 2009  (JP) ................. 2009-196571

(51) Int. Cl.
*G06F 15/02*     (2006.01)
*G06F 3/023*     (2006.01)
(Continued)

(52) U.S. Cl.
CPC .......... *G06F 15/0225* (2013.01); *G06F 3/0237* (2013.01); *G06F 3/0238* (2013.01);
(Continued)

(58) Field of Classification Search
CPC ... G06F 3/0233; G06F 3/0237; G06F 3/0219; G06F 3/048; G06F 15/0225; G06F 3/0238; H04M 1/7258; H04M 1/0235; H04M 1/56; H04M 1/72522; H04M 2250/18; H04M 2250/70; H03M 11/04

USPC .......................................................... 345/168
See application file for complete search history.

(56) References Cited

U.S. PATENT DOCUMENTS 6,636,162 B1 * 10/2003 Kushler ................. G06F 3/018
                                                                341/22
6,847,310 B1   1/2005 Gill et al.
(Continued)

FOREIGN PATENT DOCUMENTS

JP      2003-125053 A     4/2003
JP      2005-531064 A    10/2005
(Continued)

OTHER PUBLICATIONS

International Search Report for PCT/JP2010/064585, mailed on Nov. 9, 2010.
(Continued)

*Primary Examiner* — Temesgh Ghebretinsae
*Assistant Examiner* — Michael J Jansen, II
(74) *Attorney, Agent, or Firm* — Hauptman Ham, LLP

(57) ABSTRACT

A handheld electronic device and display method for a handheld electronic device provide for an initialization screen to be displayed by a display unit, in response to user input, to display symbols reflecting an intent of the user. The handheld electronic device includes a user input unit having a first key to which a symbol of a first type is allocated and a symbol of a second type is not allocated, and a second key to which a symbol of the first type and a symbol of the second type are both allocated; a display unit that, upon input via the user input unit, displays a symbol of the first type and/or a symbol of the second type; and a control unit that controls what the display unit displays.

6 Claims, 12 Drawing Sheets

(51) Int. Cl.
*H03M 11/04* (2006.01)
*H04M 1/56* (2006.01)
*H04M 1/725* (2006.01)
*H04M 1/02* (2006.01)

(52) U.S. Cl.
CPC ............... *H03M 11/04* (2013.01); *H04M 1/56* (2013.01); *H04M 1/72522* (2013.01); *H04M 1/0235* (2013.01); *H04M 2250/18* (2013.01); *H04M 2250/70* (2013.01)

(56) References Cited

U.S. PATENT DOCUMENTS

| | | | | |
|---|---|---|---|---|
| 7,936,337 | B2* | 5/2011 | Fux et al. ................. | 345/169 |
| 8,207,832 | B2* | 6/2012 | Yun et al. ................. | 340/407.2 |
| 8,422,661 | B2* | 4/2013 | Suzuki et al. ............ | 379/387.02 |
| 2003/0117375 | A1* | 6/2003 | Suda ........................... | 345/169 |
| 2004/0164951 | A1* | 8/2004 | Lun Pun .............. | G06F 3/0233 345/156 |
| 2005/0283358 | A1* | 12/2005 | Stephanick ........... | G06F 3/0233 704/7 |
| 2006/0135229 | A1 | 6/2006 | Kwak et al. | |
| 2007/0266013 | A1 | 11/2007 | Kang et al. | |
| 2008/0117174 | A1* | 5/2008 | Hawkins et al. .............. | 345/169 |
| 2008/0168075 | A1* | 7/2008 | Kamiyabu ..................... | 707/100 |
| 2008/0291059 | A1* | 11/2008 | Longe .................. | G06F 3/0237 341/22 |
| 2009/0027345 | A1* | 1/2009 | Fux et al. ...................... | 345/169 |
| 2009/0131117 | A1* | 5/2009 | Choi ............................. | 455/566 |
| 2009/0154682 | A1* | 6/2009 | Qiu .......................... | H04M 1/26 379/216.01 |
| 2009/0280863 | A1* | 11/2009 | Shin et al. ..................... | 455/557 |
| 2009/0322498 | A1* | 12/2009 | Yun et al. ................... | 340/407.2 |

FOREIGN PATENT DOCUMENTS

| | | |
|---|---|---|
| JP | 2006-178924 A | 7/2006 |
| JP | 2006-293965 A | 10/2006 |
| JP | 2007-141249 A | 6/2007 |
| JP | 2008-520032 A | 6/2008 |

OTHER PUBLICATIONS

Notice of Reasons for Rejection issued to JP Application No. 2009-196571, mailed Apr. 9, 2013.

* cited by examiner

HANDHELD ELECTRONIC DEVICE AND DISPLAY METHOD FOR A HANDHELD ELECTRONIC DEVICE

CROSS-REFERENCE TO RELATED APPLICATIONS

This application is the National Stage of International Application No. PCT/JP2010/064585, filed Aug. 27, 2010, which claims the benefit of Japanese Application No. 2009-196571, filed Aug. 27, 2009, the entire contents of both of which are incorporated by reference herein.

FIELD OF THE INVENTION

The present invention relates to a portable electronic device and a display method for the portable electronic device, in which the portable electronic device includes: operation keys assigned with nonnumeric characters but not numeric characters; and operation keys assigned with the nonnumeric characters and the numeric characters.

BACKGROUND OF THE INVENTION

Some portable electronic devices such as cellular telephone devices and the like include: an operation unit that is configured to include first keys assigned with nonnumeric characters but not numeric characters, and second keys assigned with the nonnumeric characters and the numeric characters; a display unit that displays at least one of the nonnumeric characters and the numeric characters in accordance with an operation of the operation unit; and a control unit that controls content displayed on the display unit (for example, see Patent Document 1).

Patent Document 1: Japanese Unexamined Patent Application, Publication No. 2006-293965

SUMMARY OF THE INVENTION

Problems to be Solved by the Invention

In a cellular telephone device, a display unit displays an initial screen while waiting for an incoming call, and while waiting for activation of an application. However, in the cellular telephone device, in a case in which any one of first keys is operated while the initial screen is displayed on the display unit, the display unit has not been capable of displaying a character corresponding to the first key thus operated. Moreover, in the cellular telephone device, in a case in which any one of second keys is operated while the initial screen is displayed on the display unit, although the display unit has been capable of displaying a numeric character corresponding to the second key thus operated, the display unit has not been capable of displaying a nonnumeric character corresponding to the second key thus operated.

An object of the present invention is to provide a portable electronic device and a display method for the portable electronic device, which are capable of displaying characters reflecting a user's intention, in accordance with characters assigned to the operated keys while the initial screen is displayed on the display unit.

Means for Solving the Problems

A portable electronic device according to the present invention includes: an operation unit that includes first keys assigned with first type characters but not assigned with second type characters, and second keys assigned with the first type characters and the second type characters; a display unit that displays at least one of the first type characters and the second type characters in accordance with an operation of the operation unit; and a control unit that controls content displayed on the display unit; in which, in a state where an initial screen is displayed on the display unit, in a case in which any one of the first keys is operated, the control unit displays the first type character assigned to the first key thus operated on the display unit, and in a case in which any one of the second keys is operated, the control unit displays the first type character and the second type character assigned to the second key thus operated on the display unit.

Moreover, in a state where the first type character and second type character are displayed on the display unit as a result of operating the second key, in a case in which any one of the first keys is operated, the control unit preferably cancels displaying the second type character displayed on the display unit.

In addition, the operation unit preferably includes a plurality of the first keys, and the control unit preferably cancels displaying the second type character in a case in which the plurality of first keys are operated more than a predetermined number of times.

Furthermore, the portable electronic device preferably further includes a communication unit, wherein the second type characters are preferably numeric characters, the operation unit preferably includes a calling key assigned with none of the first type characters and the second type characters, and in a state where the numeric characters are displayed on the display unit as a result of operating the second keys, when the calling key is operated, the control unit preferably controls the communication unit to make a call to a communication party represented by the numeric characters displayed on the display unit.

Moreover, in the portable electronic device, the first type characters are preferably alphabetic characters, and the second type characters are preferably numeric characters, and in a state where the alphabetic characters and the numeric characters are displayed on the display unit as a result of operating the second keys, in a case in which the alphabetic characters cannot be converted into Japanese kana characters, the control unit preferably cancels displaying the alphabetic characters displayed on the display unit.

In addition, the operation unit preferably further includes: a first body in which the display unit is disposed; and a second body in which the operation unit is disposed, the second body configuring an opened state by moving in relation to the first body, or configuring a closed state by being disposed so as to be superimposed on the first body, and in the opened state of the first body and the second body, in a state where the first type characters and second type characters are displayed on the display unit as a result of operating the second keys, in a case in which the control unit detects transition from the opened state to the closed state, the control unit preferably cancels displaying the first type characters displayed on the display unit.

Furthermore, in a case of detecting transition to the opened state within a predetermined period of time after detecting transition from the opened state to the closed state, the control unit preferably displays the first type characters, whose display has been cancelled, on the display unit again.

Moreover, a portable electronic device according to the present invention includes a first body and a second body, in which the first body including a first operation unit and the second body including a second operation unit are connected so as to be openable and closable; the second operation unit is covered with the first body in a closed state, and is exposed to the outside in an opened state; the first operation unit is exposed to the outside in both the closed state and the opened state; the portable electronic device comprising: a display unit that displays at least one of first type characters and second type characters in accordance with an operation of the first operation unit or the second operation unit; and a control unit that controls content displayed on the display unit; in which the first operation unit includes first keys assigned with the first type characters and the second type characters; the second operation unit includes second keys assigned with the first type characters but not assigned with the second type characters; and third keys assigned with the first type characters and the second type characters; and in a state where an initial screen is displayed on the display unit, in a case in which any one of the first keys is operated, the control unit displays the second type character assigned to the first key thus operated on the display unit, and in a case in which any one of the second keys or the third keys is operated, the control unit displays the first type character assigned to the second key or the third key thus operated on the display unit.

In addition, a display method for a portable electronic device according to the present invention is a display method applied to a portable electronic device that includes: an operation unit that is configured to include first keys assigned with first type characters but not assigned with second type characters, and second keys assigned with the first type characters and the second type characters; and a display unit that displays at least one of the first type characters and the second type characters in accordance with an operation of the operation unit; in which, in a state where an initial screen is displayed on the display unit, in a case in which any one of the first keys is operated, the method displays the first type character assigned to the first key thus operated on the display unit, and in a case in which any one of the second keys is operated, the method displays the first type character and the second type character assigned to the second key thus operated on the display unit.

Effects of the Invention

According to the present invention, in a case in which an initial screen is displayed on a display unit, it is possible to display characters reflecting the user's intention in accordance with an operation.

Figure 1:
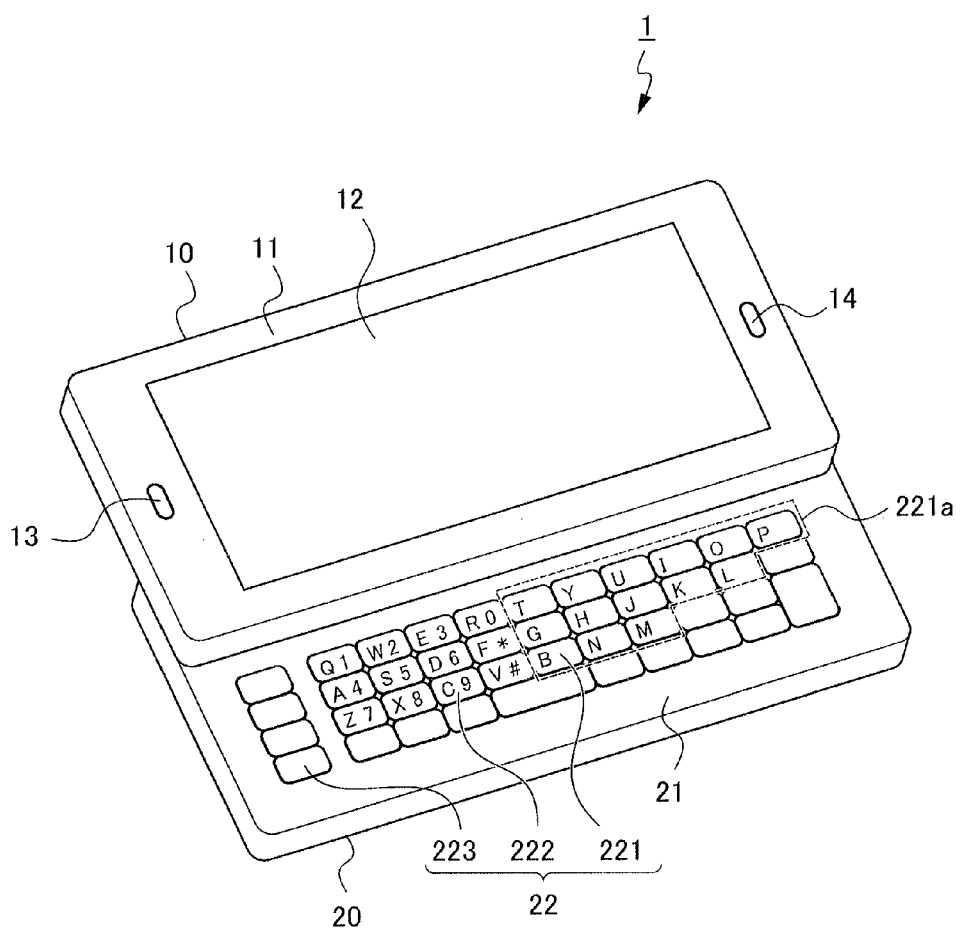
FIG. 1 is an external perspective view of a cellular telephone device as a first embodiment of a portable electronic device.

EXPLANATION OF REFERENCE NUMERALS 1 cellular telephone device (portable electronic device)
2 cellular telephone device (portable electronic device)
10 first body
12 display unit
20 second body
22 operation unit
35 control unit
40 initial screen
41 first type character display area
42 second type character display area
50 first operation unit
51 second operation unit
221 first key
222 second key
501 first key
511 second key
512 third key

DETAILED DESCRIPTION OF THE INVENTION

First Embodiment

Descriptions are provided hereinafter regarding preferred embodiments for carrying out the present invention with reference to the drawings. First, with reference to FIG. 1, descriptions are provided regarding a basic structure of a cellular telephone device 1 as a first embodiment of the portable electronic device of the present invention.

FIG. 1 is an external perspective view of the cellular telephone device 1 as the first embodiment of the portable electronic device.

The cellular telephone device 1 includes a first body 10 and a second body 20.

A display unit 12 is disposed on a front face 11 of the first body 10. The display unit 12 displays at least one of first type characters and second type characters in accordance with an operation of an operation unit 22 that will be described later. Moreover, the display unit 12 displays various types of information (nonnumeric character information, numeric character information, and image information) such as telephone numbers, email addresses of communication parties, and email content.

In addition, a microphone 13 and a receiver 14 are disposed on the front face 11 of the first body 10. The microphone 13 is used for inputting sound produced by a user of the cellular telephone device 1 during a telephone call. The receiver 14 outputs sound of communication parties.

Furthermore, a speaker 15 (see FIG. 2) is disposed on a side face of the first body 10. The speaker 15 outputs sound or the like giving notification of an incoming call to the cellular telephone device 1.

An operation unit 22 is disposed on a front face 21 of the second body 20. The front face 21 of the second body 20 is a face opposing a rear face of the first body 10 (a face opposite to the front face 11 of the first body 10)

The second body 20 configures an opened state by moving in relation to the first body 10, or configures a closed state by being disposed so as to be superimposed on the first body 10. In other words, the cellular telephone device 1 configures the closed state when the first body 10 and the second body 20 are disposed so as to be superimposed on each other in a planar view. Moreover, as shown in FIG. 1, the cellular telephone device 1 configures the opened state when the second body 20 is pulled out laterally in relation to the first body (or when the first body 10 is pushed out laterally in relation to the second body 20).

The operation unit 22 is operational when the first body 10 and the second body 20 are moved in relation to each other to transition to the opened state. The operation unit 22 includes first keys 221 assigned with the first type characters, and second keys 222 assigned with the first type characters and the second type characters.

Figure 2:
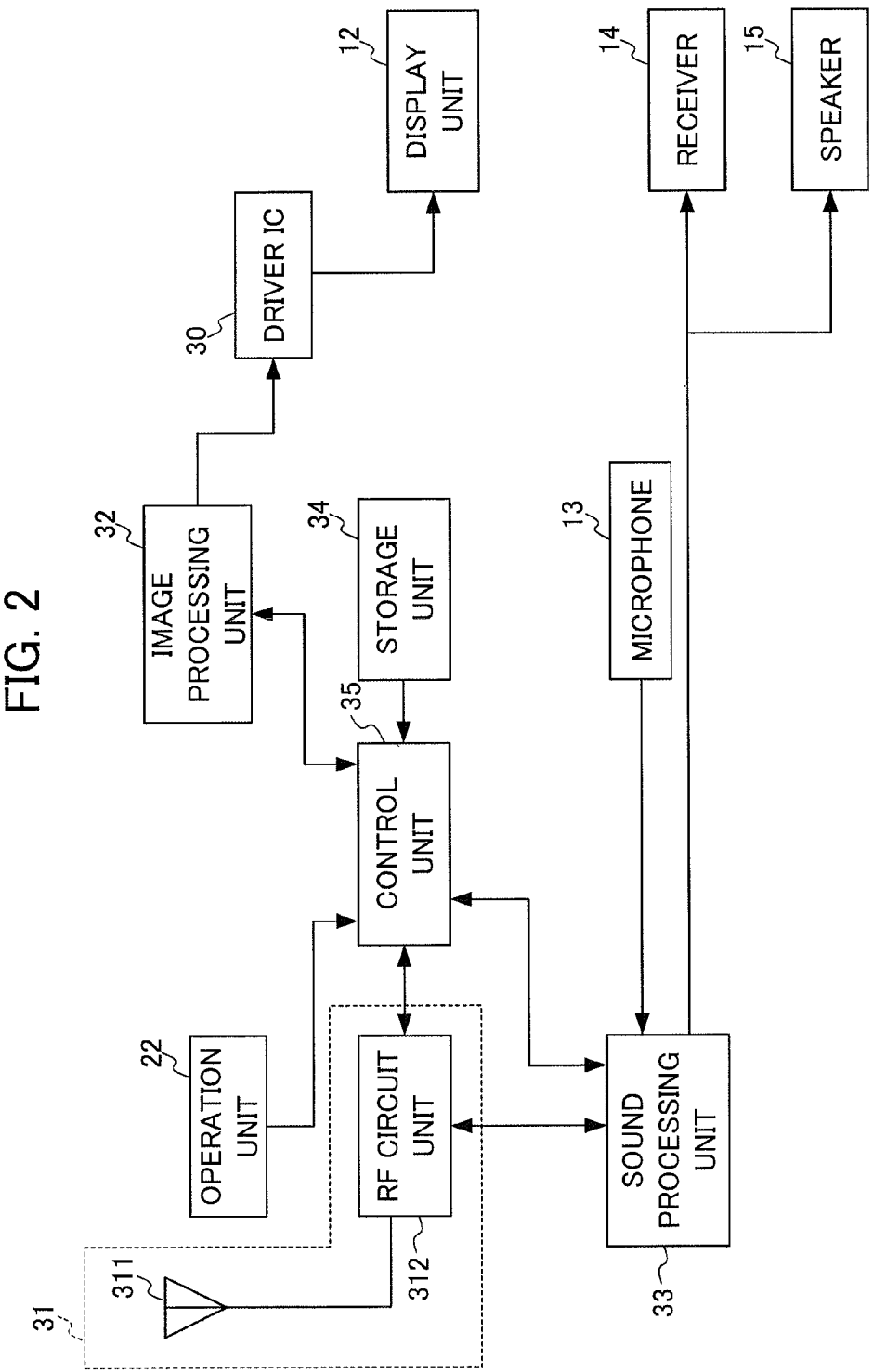
FIG. 2 is a block diagram showing a functional configuration of the cellular telephone device as the first embodiment of the portable electronic device.

Next, descriptions are provided regarding a functional configuration of the cellular telephone device 1 with reference to FIG. 2.

FIG. 2 is a block diagram showing a functional configuration of the cellular telephone device 1. The cellular telephone device 1 includes the operation unit 22, the microphone 13, the display unit 12, the receiver 14, the speaker 15, a driver IC 30, a communication unit 31, an image processing unit 32, a sound processing unit 33, a storage unit 34, and a control unit 35.

The communication unit 31 is configured to include a main antenna 311 and an RF circuit unit 312, and performs communication with predetermined communication parties. Examples of the communication parties with which the communication unit 31 performs communication include an outside terminal device that makes a telephone call or transmission/reception of email with the cellular telephone device 1, or an external device such as an outside web server with which the cellular telephone device 1 establishes an Internet connection.

The main antenna 311 performs communication with an external device with a predetermined usable frequency band.

The RF circuit unit 312 executes demodulation processing on a signal received via the main antenna 311, and transmits the signal thus processed to the control unit 35. Moreover, the RF circuit unit 312 executes modulation processing on the signal transmitted from the control unit 35, and transmits the signal to external devices (base stations) via the main antenna 311.

The image processing unit 32 executes predetermined image processing, and outputs the processed image data to the driver IC 30, according to control by the control unit 35. When the image data is transmitted from the image processing unit 32, the driver IC 30 stores the image data in frame memory (not illustrated), and outputs the image data to the display unit 12 at predetermined timing.

The sound processing unit 33 executes predetermined sound processing on a signal transmitted from the RF circuit unit 312 according to control by the control unit 35, and outputs the signal thus processed to the receiver 14 or the speaker 15. The receiver 14 or the speaker 15 externally outputs the signal transmitted from the sound processing unit 33.

In addition, when a signal is input from the microphone 13, the sound processing unit 33 processes the signal, and outputs the signal thus processed to the RF circuit unit 312, according to control by the control unit 35. The RF circuit unit 312 executes predetermined processing on the signal transmitted from the sound processing unit 33, and transmits the signal thus processed to the main antenna 311 that externally outputs the signal as radio waves.

The storage unit 34 includes, for example, working memory, and is utilized for arithmetic processing by the control unit 35. Furthermore, the storage unit 34 stores data, tables and the like, which are utilized by various applications running on the cellular telephone device 1. It should be noted that the memory 34 may be a detachable external memory.

The control unit 35 controls the entirety of the cellular telephone device 1, and performs predetermined control of the display unit 12, the communication unit 31, the image processing unit 32, and the sound processing unit 33. Specific operations of the control unit 35 will be described later.

The cellular telephone device 1 that is configured as above has a function such that, in a case in which an initial screen is displayed on the display unit 12, characters reflecting the user's intention are displayed in accordance with the characters assigned to the operated keys.

Descriptions are hereinafter provided regarding a configuration and operations for achieving the abovementioned function according to the cellular telephone device 1.

First, descriptions are provided regarding a configuration for achieving the abovementioned function of the cellular telephone device 1 according to the present embodiment.

The cellular telephone device 1 includes the operation unit 22 and the display unit 12.

As shown in FIG. 1, the operation unit 22 includes the first keys 221 assigned with the first type characters but not second type characters, and the second keys 222 assigned with the first type characters and the second type characters. The first keys 221 and the second keys 222 are, for example, keys in a QWERTY keyboard as shown in FIG. 1. It should be noted that the keys assigned with the first type characters and second type characters are not limited to the example shown in FIG. 1.

Figure 3A:
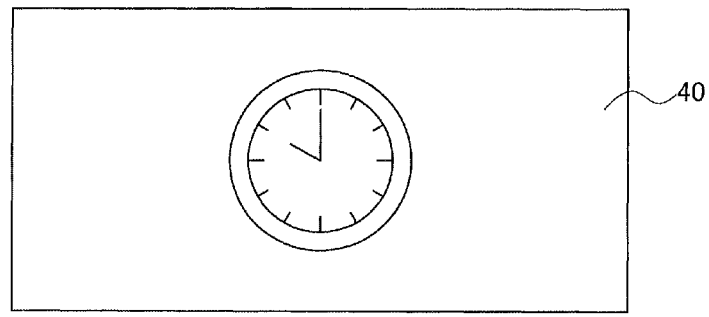
FIG. 3 is a diagram illustrating a first transition of a display mode of a display unit.
Figure 3A:
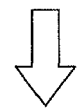

The display unit 12 displays at least one of the first type characters and the second type characters in accordance with an operation of the operation unit 22, and includes at least one of a first type character display area 41 that displays the first type characters, and a second type character display area 42 that displays the second type characters. When an initial screen 40 is displayed on the display unit 12 (see FIG. 3A), in a case in which any one of the second keys 222 is depressed, the display area of the display unit 12 is divided into the first type character display area 41 that displays the first type characters, and the second type character display area 42 that displays the second type characters (see FIG. 3B).

The character string of the second type characters displayed in the second type character display area 42 serves as a telephone number. Therefore, in a case in which a calling key 223 is depressed in a state where the telephone number is displayed in the second type character display area 42, the cellular telephone device 1 can make an outgoing telephone call.

It should be noted that the first type characters are nonnumeric characters such as alphabetic characters, hiragana characters, katakana characters and kanji characters. Moreover, the second type characters are numeric characters and, for example, symbols utilized for an outgoing telephone call, such as "# (hash mark)", "* (asterisk)", "- (hyphen)", "P (pause)" and the like.

The control unit 35 controls content displayed on the display unit 12.

In a state where the initial screen 40 is displayed on the display unit 12, in a case in which any one of the first keys 221 is operated, the control unit 35 displays the first type character assigned to the operated first key 221 on the display unit 12, and in a case in which any one of the second keys 222 is operated, the control unit 35 displays the first type character and the second type character assigned to the operated second key 222 on the display unit 12. Here, the initial screen 40 is a so-called wallpaper screen on standby for communication, in which neither the email application nor the memo pad application is activated.

Figure 3B:
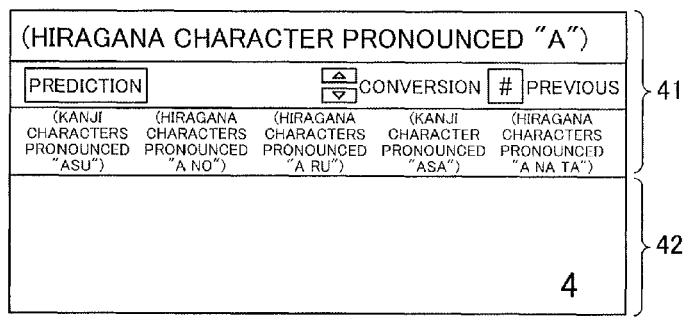
Figure 3B:
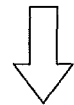

In other words, in a case in which any one of the first keys 221 is operated, the control unit 35 displays the first type character in the first type character display area 41 of the display unit 12. In addition, in a case in which any one of the second keys 222 is operated, the control unit 35 displays the first type character in the first type character display area 41 of the display unit 12, and displays the second type character in the second type character display area 42 of the display unit 12. For example, as shown in FIG. 3B, in a case in which a second key 222 assigned with an alphabetic character "A" and a numeric character "4" is depressed, the control unit 35 displays a hiragana character with the pronunciation "a" in the first type character display area 41 of the display unit 12, and displays the numeric character "4" in the second type character display area 42 of the display unit 12. It should be noted that since the control unit 35 is set to perform Japanese kana conversion in the present example, even in a case in which the second key 222 assigned with the alphabetic character "A" is depressed, the control unit 35 displays the hiragana character with the pronunciation "a" on the display unit 12.

Therefore, in a case in which the initial screen 40 is displayed on the display unit 12, the cellular telephone device 1 can display characters reflecting the user's intention in accordance with the characters assigned to the operated keys.

In other words, in a case in which any one of the first keys 221 assigned with the first type character (nonnumeric character) is operated, the cellular telephone device 1 displays a character corresponding to the first key 221. Furthermore, in a case in which any one of the second keys 222 assigned with the first type character (nonnumeric character) and the second type character (numeric character) is operated, the cellular telephone device 1 parallely displays the first type character (nonnumeric character) and the second type character (numeric character) corresponding to the second key 222 on the display unit 12. As a result, the cellular telephone device 1 can make a display that reflects the user's intention.

Moreover, in a state where the first type character and second type character are displayed on the display unit 12 as a result of operating any one of the second keys 222, in a case in which any one of the first keys 221 is operated, the control unit 35 cancels displaying the second type character displayed on the display unit 12.

Figure 3C:
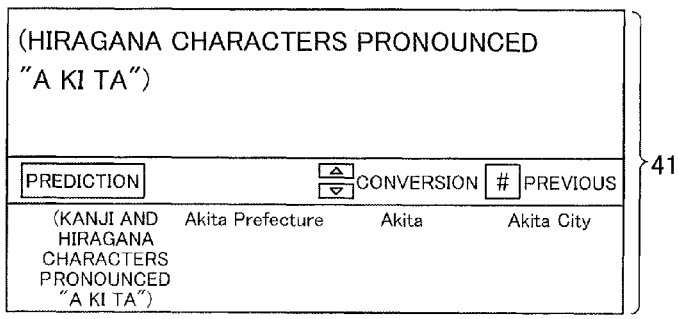

In other words, in a state where the first type character is displayed in the first type character display area 41, and the second type character is displayed in the second type character display area 42 as a result of depressing any one of the second keys 222, in a case in which any one of the first keys 221 is depressed, the control unit 35 cancels displaying the second type character display area 42 from the display unit 12, and displays only the first type character display area 41 on the display unit 12 (see FIG. 3C).

Therefore, in a state where the first type character (nonnumeric character) and the second type character (numeric character) corresponding to the second key 222 are parallely displayed on the display unit 12 as a result of operating the second key 222 assigned with the first type character (nonnumeric character) and the second type character (numeric character), in a case in which any one of the first keys 221 assigned with the first type character (nonnumeric character) is operated, a switch is made to display only the first type characters (nonnumeric characters); accordingly, it is possible to make a display that reflects the user's intention.

In addition, the cellular telephone device 1 has the plurality of first keys 221. Furthermore, in a state where the first type character and second type character are displayed on the display unit 12 as a result of operating any one of the second keys 222, in a case in which the first keys 221 are operated more than a predetermined number of times, the control unit 35 cancels displaying the second type character displayed on the display unit 12.

In other words, in a state where the first type character display area 41 and the second type character display area 42 are displayed on the display unit 12, in a case in which the plurality of first keys 221 are operated more than a predetermined number of times, the control unit 35 cancels displaying the second type character display area 42 from the display unit 12, and displays only the first type character display area 41 on the display unit 12. It should be noted that the predetermined number of times may be appropriately set by the user.

Therefore, in a state where the first type character (nonnumeric character) and the second type character (numeric character) corresponding to the second key 222 are parallely displayed on the display unit 12 as a result of operating the second key 222 assigned with the first type character (nonnumeric character) and the second type character (numeric character), in a case in which the first keys 221 assigned with the first type character (nonnumeric character) are operated more than a predetermined number of times, the cellular telephone device 1 displays only the first type character (nonnumeric character); accordingly, it is possible to prevent an incorrect display due to incorrect input, and to make a display that reflects the user's intention.

Moreover, in the cellular telephone device 1, the plurality of first keys 221 compose a first key group 221*a*. In addition, in a case in which the first keys 221 composing the first key group 221*a* are operated more than a predetermined number of times, the control unit 35 cancels displaying the second type characters.

In other words, in a state where the first type character display area 41 and the second type character display area 42 are displayed on the display unit 12, in a case in which the first keys 221 composing the first key group 221*a* are operated more than a predetermined number of times, the control unit 35 cancels displaying the second type character display area 42 from the display unit 12, and displays only the first type character display area 41 on the display unit 12.

Therefore, in a state where the first type character (nonnumeric character) and the second type character (numeric character) corresponding to the second key 222 are parallely displayed on the display unit 12 as a result of operating the second key 222 assigned with the first type character (nonnumeric character) and the second type character (numeric character), in a case in which the first keys 221 in the first key group 221*a* assigned with the first type characters (nonnumeric characters) are operated more than a predetermined number of times, the cellular telephone device 1 displays only the first type characters (nonnumeric characters); accordingly, it is possible to prevent an incorrect display due to incorrect input, and to make a display that reflects the user's intention.

The cellular telephone device 1 further includes the communication unit 31. Furthermore, the first type characters are alphabetic characters, and the second type characters are numeric characters.

Moreover, the operation unit 22 has the calling key 223 (see FIG. 1), to which none of alphabetic characters and numeric characters are assigned. It should be noted that the position for disposing the calling key 223 is not limited to the position shown in FIG. 1, and may be another position. In other words, a telephone calling function may be assigned to any one of the plurality of keys that compose the operation unit 22. In addition, the calling key 223 is not limited to being disposed in the first body 10, and may be disposed in the second body 20.

Furthermore, in a state where numeric characters are displayed on the display unit 12 as a result of operating the second keys 222, when the calling key 223 is operated, the control unit 35 controls the communication unit 31 to make a call by using the numeric characters displayed on the display unit 12 as a telephone number of a communication party.

In other words, in a state where alphabetic characters are displayed in the first type character display area 41, and numeric characters are displayed in the second type character display area 42, in a case in which the calling key 223 is operated, the control unit 35 uses the numeric characters displayed in the second type character display area 42 as a telephone number, and makes a call to the telephone number. It should be noted that Japanese kana characters (hiragana characters and katakana characters) converted from alphabetic characters that were input based on an operation of the second keys 222, or other characters (kanji characters) further converted from the converted kana characters may be displayed in the first type character display area 41.

Therefore, even in a case in which an alphabetic character string and a numeric character string are parallely displayed on the display unit 12, the cellular telephone device 1 can make a telephone call to a telephone number (the numeric character string) displayed on the display unit 12, based on an operation of the calling key 223.

Moreover, the first type characters are alphabetic characters, and the second type characters are numeric characters. In addition, in a state where alphabetic characters and numeric characters are displayed on the display unit 12 as a result of operating the second keys 222, in a case in which the alphabetic characters cannot be converted into Japanese kana characters, the control unit 35 cancels displaying the alphabetic characters displayed on the display unit 12.

Here, descriptions are provided regarding Japanese kana conversion. In a case of performing Japanese kana conversion, the storage unit 34 of the cellular telephone device 1 stores a conversion table that is utilized for converting alphabetic characters into Japanese kana characters. The conversion table contains Japanese kana characters each corresponding to a consonant and a vowel. For example, in the conversion table, a hiragana character with the pronunciation "sa" is associated with a consonant "s" and a vowel "a"; and a hiragana character with the pronunciation "yo" is associated with a consonant "y" and a vowel "o". Furthermore, in a case in which alphabetic characters are input by depressing the second keys 222, the control unit 35 refers to the conversion table to distinguish a Japanese kana character that is associated with a consonant and a vowel of the alphabetic characters.

Incidentally, in a case in which, for example, consonants are consecutively input (for example, in a case in which an alphabetic character string "rcrsd" is input), such a character string cannot be converted into Japanese kana characters. In this way, in a case in which alphabetic characters were input by depressing the second keys 222, and the input alphabetic characters cannot be converted into Japanese kana characters, the control unit 35 cancels displaying the first type character display area 41 from the display unit 12, and displays only the second type character display area 42 on the display unit 12.

It should be noted that in a case in which more than a predetermined number of consonant characters are consecutively input, the control unit 35 can cancel displaying the first type character display area 41 from the display unit 12, and display only the second type character display area 42 on the display unit 12.

Therefore, in a state where the first type characters (non-numeric characters) and the second type characters (numeric characters) corresponding to the operated second keys 222 are parallely displayed on the display unit 12 as a result of operating the first keys 221 assigned with the first type characters (nonnumeric characters) or the second keys 222 assigned with the first type characters (nonnumeric characters) and the second type characters (numeric characters), in a case in which the first type characters (alphabetic characters) displayed in the first type character display area 41 of the display unit 12 cannot be converted into Japanese kana characters, the cellular telephone device 1 displays only the second type character display area 42 on the display unit 12; accordingly, it is possible to make a display that reflects the user's intention.

The cellular telephone device 1 further includes the first body 10 and the second body 20.

The display unit 12 is disposed to the first body 10.

The operation unit 22 is disposed in the second body 20. In addition, the second body 20 configures the opened state by moving in relation to the first body 10, or configures the closed state by being disposed so as to be superimposed on the first body 10.

In other words, the cellular telephone device 1 is a slider type cellular telephone device or a turning type cellular telephone device, in which the first body 10 and the second body 20 are moved in relation to each other.

In the opened state of the first body 10 and the second body 20, in a state where the first type characters and second type characters are displayed on the display unit 12 as a result of operating the second keys 222, in a case in which the control unit 35 detects transition from the opened state to the closed state, the control unit 35 cancels displaying the first type characters displayed on the display unit 12.

In other words, when the first body 10 and the second body 20 are moved in relation to each other to transition to the opened state, and the first type character display area 41 and the second type character display area 42 are displayed on the display unit 12, in a case in which the first body 10 and the second body 20 are moved relatively to transition from the opened state to the closed state, the control unit 35 determines that a telephone call will be made, cancels displaying the first type character display area 41 from the display unit 12, and displays only the second type character display area 42 on the display unit 12.

It should be noted that transition from the opened state to the closed state of the first body 10 and the second body 20 may be detected, and display control according to the control unit 35 may be performed, for example, as follows. In other words, a detecting unit (not illustrated), which detects the closed state in which the first body 10 and the second body 20 are superimposed on each other, is provided to at least one of the first body 10 and the second body 20. When the detecting unit detects the closed state of the first body 10 and the second body 20, the detecting unit transmits a trigger signal indicating a detection result to the control unit 35. When the control unit 35 receives the trigger signal from the detecting unit, the control unit 35 cancels displaying the first type character display area 41 from the display unit 12, and displays only the second type character display area 42 on the display unit 12.

Therefore, in a state where the first type characters (non-numeric characters) and the second type characters (numeric characters) corresponding to the second keys 222 are parallely displayed on the display unit 12 as a result of operating the second keys 222 assigned with the first type characters (nonnumeric characters) and the second type characters (numeric characters) in the opened state of the first body 10 and the second body 20, in a case in which the first body 10 and the second body 20 transitions from the opened state to the closed state, the cellular telephone device 1 determines that the display of the first type characters (nonnumeric characters) is unnecessary, and thus switches to display only the second type characters (numeric characters); accordingly, it is possible to make a display that reflects the user's intention.

Furthermore, in a case of detecting a transition to the opened state within a predetermined period of time after detecting a transition from the opened state to the closed state of the first body 10 and the second body 20, the control unit 35 displays the first type characters, whose display has been cancelled, on the display unit 12 again.

In other words, in a case in which the first body 10 and the second body 20 transition to the closed state, and as a result, only the second type character display area 42 is displayed on the display unit 12, the control unit 35 stores the first type characters displayed in the first type character display area 41 to the storage unit 34. In addition, in a case in which the first body 10 and the second body 20 transition to the opened state again within a predetermined period of time after the first body 10 and the second body 20 have transitioned to the closed state, the detecting unit (not illustrated) detects that the first body 10 and the second body 20 are not in the closed state (i.e. transitioned to the opened state), and transmits the detection result as a trigger signal to the control unit 35. When the control unit 35 receives the trigger signal from the detecting unit, the control unit 35 displays the first type character display area 41 and the second type character display area 42 on the display unit 12, further reads the first type characters stored in the storage unit 34, and displays the first type characters in the first type character display area 41.

Therefore, in a case in which the first body 10 and the second body 20 transition to the opened state again within a predetermined period of time after the first body 10 and the second body 20 transitioned from the opened state to the closed state, the cellular telephone device 1 displays the first type characters, whose display has been cancelled when the first body 10 and the second body 20 transitioned from the opened state to the closed state, again in the first type character display area 41 of the display unit 12; accordingly, it is possible to prevent an incorrect display due to erroneous opening and closing of the first body 10 and the second body 20, and it is possible to make a display that reflects the user's intention.

Here, in the aforementioned embodiment, descriptions have been provided regarding conversion of alphabetic characters into Japanese kana characters in a case in which any one of the first keys 221 and the second keys 222 is operated once or a plurality of times. However, the present invention is not limited to this example, and it is also possible for alphabetic characters not to be converted into Japanese kana characters.

In this modified example, in a case in which, for example, a second key 222 assigned with an alphabetic character "A" and a numeric character "4" is operated in a state where the initial screen 40 is displayed on the display unit 12, the control unit 35 displays the first type character display area 41 where the alphabetic character "A" is input, and the second type character display area 42 where the numeric character "4" is input, on the display unit 12. Furthermore, the control unit 35 displays one or a plurality of words beginning with "A" (for example, "ARIZONA", "ALABAMA" and the like) as a predictive conversion candidate(s) in the first type character display area 41. In a case in which one word is selected from among words of the predictive conversion candidates, the control unit 35 performs displaying by replacing "A" displayed in the first type character display area 41 with the selected word.

It should be noted that, in a case in which another second key 222 (for example, a second key 222 assigned with an alphabetic character "R" and a numeric character "0") is further operated after operating the second key 222 assigned with the alphabetic character "A" and the numeric character "4", the control unit 35 inputs and displays the alphabetic character "R" after the alphabetic character "A" that is displayed in the first type character display area 41, and inputs and displays the numeric character "0" after the numeric character "4" that is displayed in the second type character display area 42. In this case, the control unit 35 displays one or a plurality of words beginning with "AR" (for example, "ARIZONA", "ARRIVE" and the like) as a predictive conversion candidate(s) in the first type character display area 41.

On the other hand, in a case in which another first key 221 (for example, a first key 222 assigned with an alphabetic character "L") is operated after operating the second key 222 assigned with the alphabetic character "A" and the numeric character "4", the control unit 35 cancels displaying the second type character display area 42 from the display unit 12, and displays only the first type character display area 41 on the display unit 12. Furthermore, the control unit 35 inputs and displays the alphabetic character "L" after the alphabetic character "A" that is displayed in the first type character display area 41. In this case, the control unit 35 displays one or a plurality of words beginning with "AL" (for example, "ALABAMA", "ALASKA" and the like) as a predictive conversion candidate(s) in the first type character display area 41.

Next, descriptions are provided regarding operations of the cellular telephone device 1 of the present embodiment.

Figure 4:
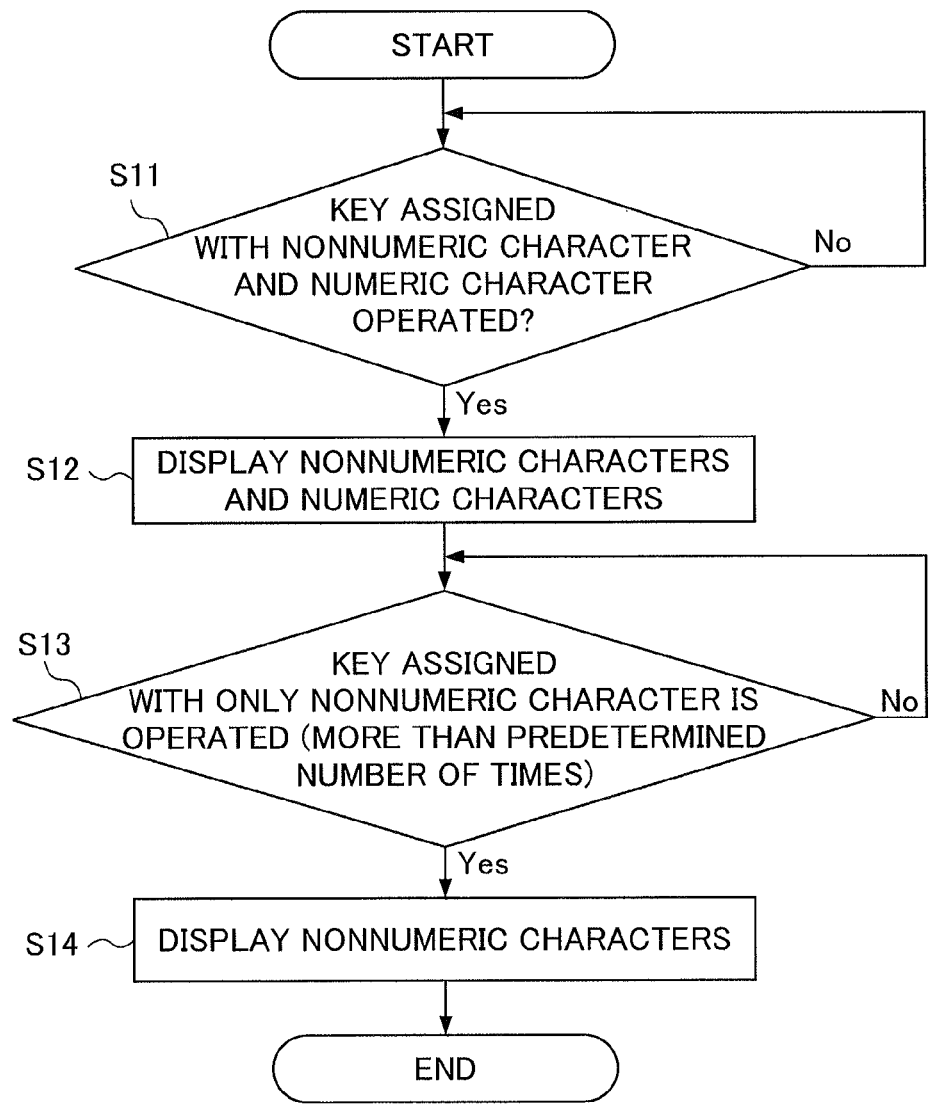
FIG. 4 is a flowchart showing a first operation of the cellular telephone device.
Figure 5A:
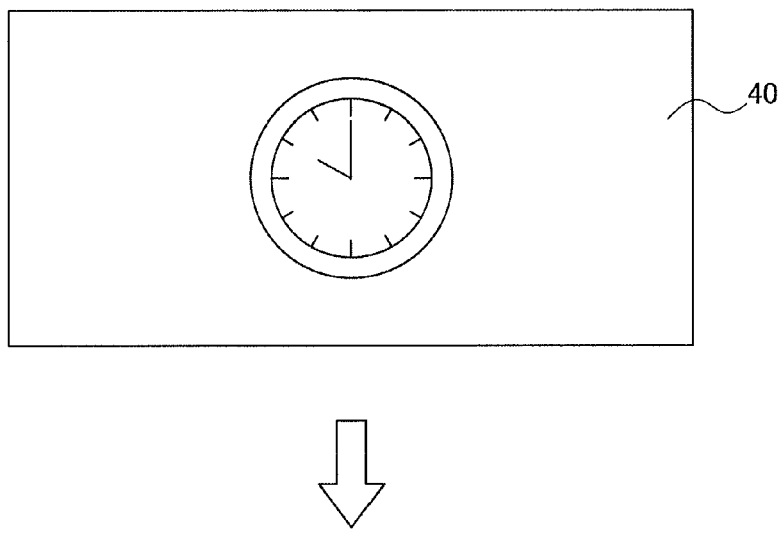
FIG. 5 is a diagram illustrating a second transition of the display mode of the display unit.
Figure 5B:
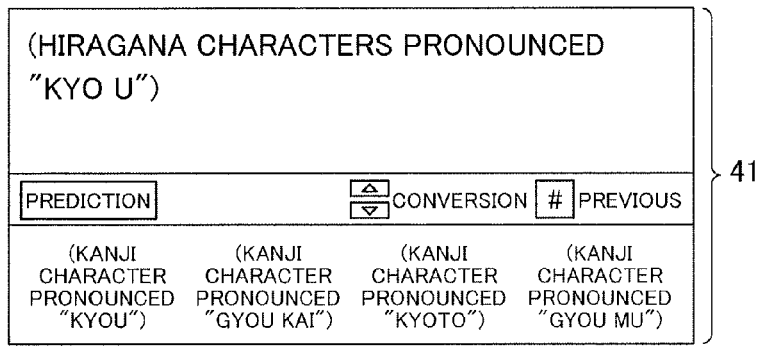
Figure 6:
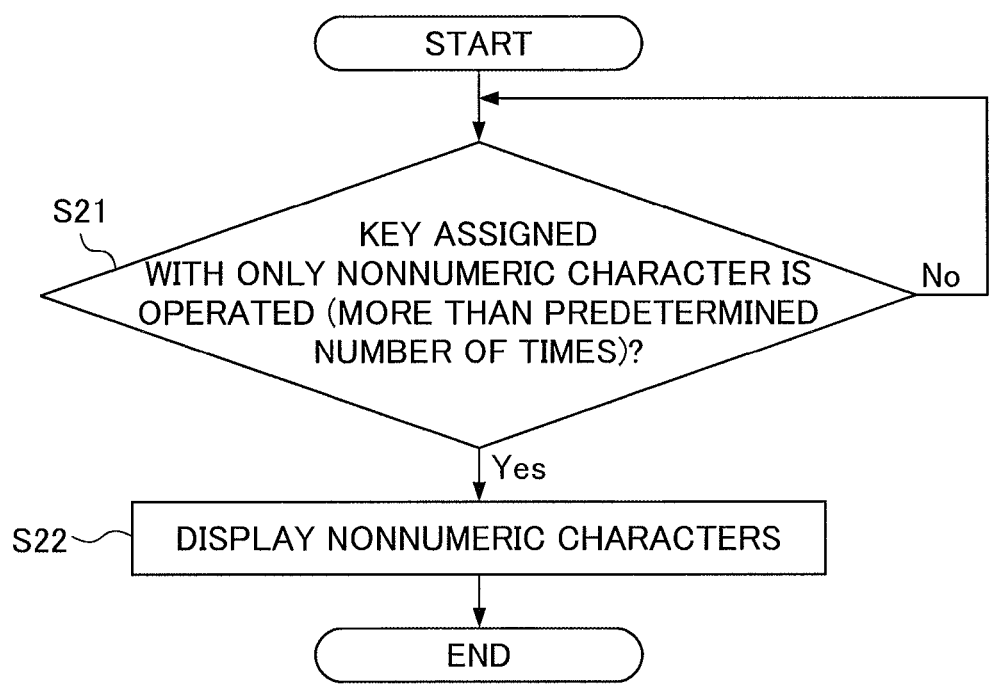
FIG. 6 is a flowchart showing a second operation of the cellular telephone device.
Figure 7A:
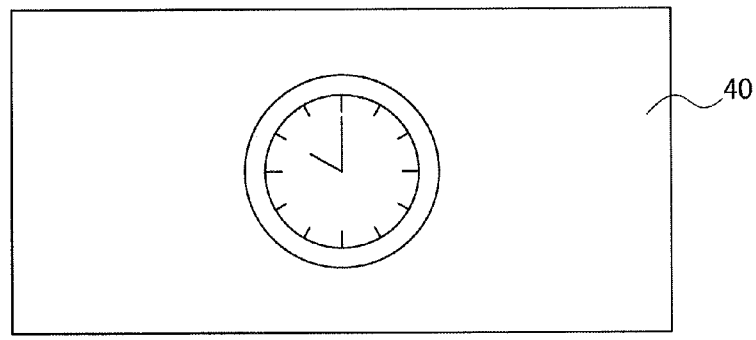
FIG. 7 is a diagram illustrating a third transition of the display mode of the display unit.
Figure 7B:
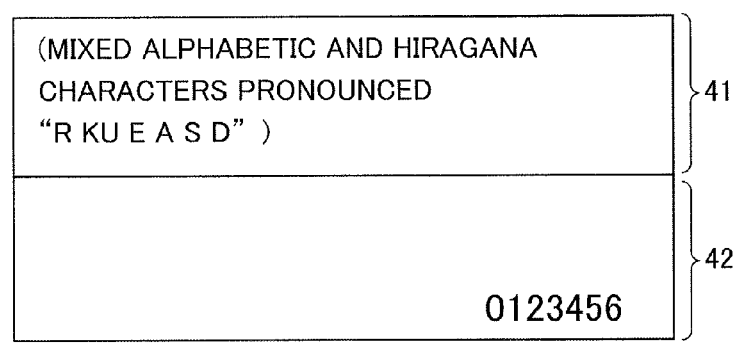
Figure 7C:
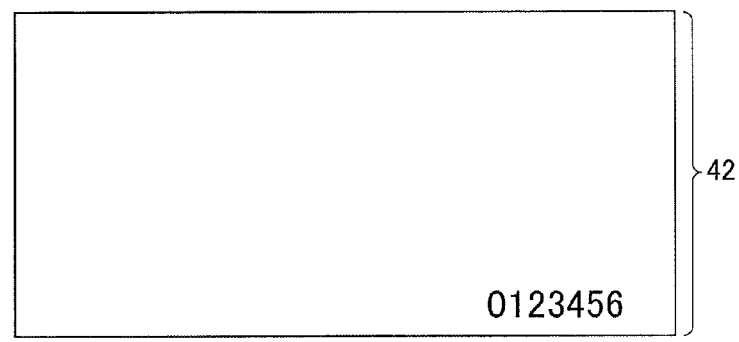
Figure 8:
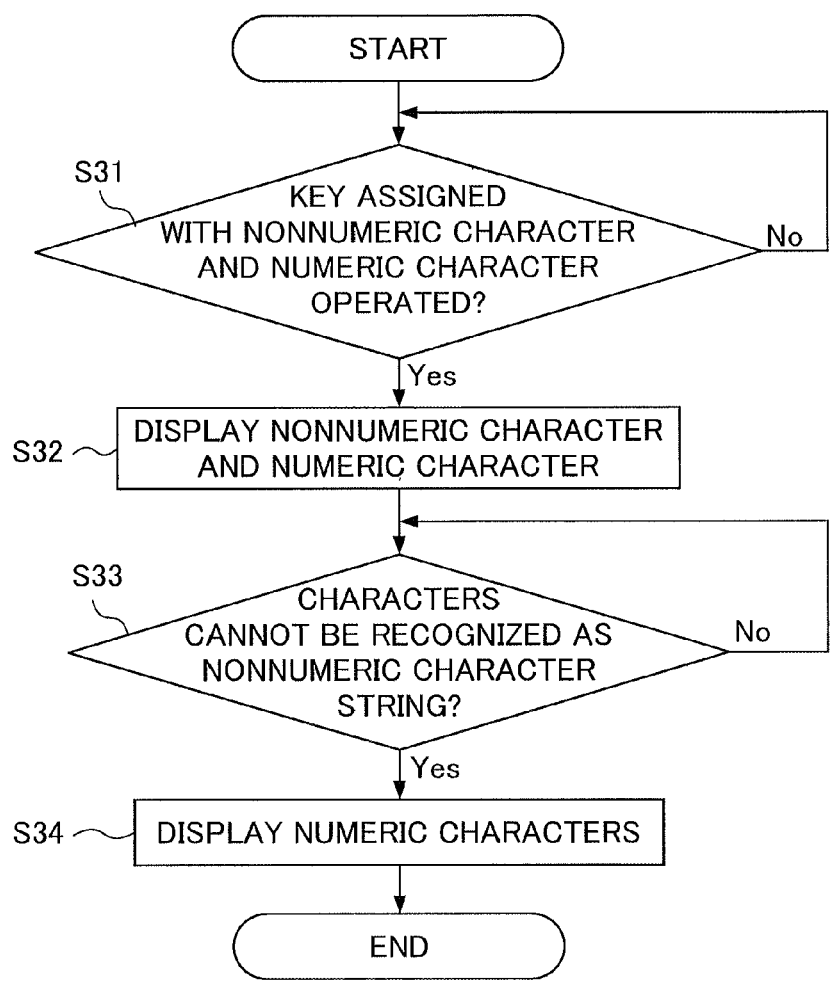
FIG. 8 is a flowchart showing a third operation of the cellular telephone device.

FIG. 3 is a diagram illustrating a first transition of a display mode of the display unit 12. FIG. 4 is a flowchart showing a first operation of the cellular telephone device 1. FIG. 5 is a diagram illustrating a second transition of the display mode of the display unit 12. FIG. 6 is a flowchart showing a second operation of the cellular telephone device 1. FIG. 7 is a diagram illustrating a third transition of the display mode of the display unit 12. FIG. 8 is a flowchart showing a third operation of the cellular telephone device 1. FIG. 9 is a diagram illustrating a fourth transition of the display mode of the display unit 12. FIG. 10 is a flowchart showing a fourth operation of the cellular telephone device 1.

First, descriptions are provided regarding the first transition of the display mode of display unit 12 with reference to FIG. 3.

In a state where the initial screen 40 on standby for an incoming telephone call is displayed on the display unit 12 (see FIG. 3A), in a case in which a second key 222 is depressed, the control unit 35 displays a first type character assigned to the depressed second key 222 in the first type character display area 41, and displays a second type character assigned to the depressed second key 222 in the second type character display area 42. For example, in a case in which a second key 222 assigned with an alphabetic character "A" and a numeric character "4" is depressed, as shown in FIG. 3B, the control unit 35 displays the hiragana character with the pronunciation "a", which is obtained through Japanese kana conversion of "A", in the first type character display area 41, and displays the numeric character "4" in the second type character display area 42. It should be noted that Japanese character strings with the pronunciation "asu (tomorrow)", "ano (that)", "aru (certain)", "asa (morning)" and "anata (you)" are displayed in the first type character display area 41 in order to perform predictive conversion of the displayed hiragana character with the pronunciation "a".

Subsequently, in a case in which a first key 221 is depressed, the control unit 35 cancels displaying the second type character display area 42 from the display unit 12, and displays only the first type character display area 41 on the display unit 12. For example, in a case in which depressing the second key 222 assigned with "A" is followed by depressing the first keys 221 assigned with "K", "I" and "T", respectively, and the second key 222 assigned with "A", as shown in FIG. 3C, since the first keys 221 are depressed, the control unit 35 cancels displaying the numeric character "4" displayed on the display unit 12 and the second type character display area 42 from the display unit 12, and displays a hiragana character string with the pronunciation "akita" in the first type character display area 41. It should be noted that, in a case in which the first keys 221 are depressed more than a predetermined number of times (three times, for example), the control unit 35 may cancel displaying the second type character display area 42 from the display unit 12, and may display only the first type character display area 41 on the display unit 12. Moreover, in a case shown in FIG. 3C, Japanese character strings with the pronunciation "akita (bored)", "Akita ken (Akita prefecture)", "Akita" and "Akita shi (Akita city)" are displayed in the first type character display area 41 in order to perform predictive conversion of the hiragana character string with the pronunciation "akita".

Next, descriptions are provided regarding the first operation of the cellular telephone device 1 with reference to FIG. 4.

Firstly, in Step S11, the control unit 35 determines whether a second key 222 assigned with a first type character (nonnumeric character) and a second type character (numeric character) was operated. In a case in which the second key 222 was operated (Yes), the processing advances to Step S12. In a case in which the second key 222 was not operated (No), the determination of Step S11 is performed again.

In Step S12, the control unit 35 displays the first type character (nonnumeric character) and the second type character (numeric character) assigned to the second key 222, which was determined to have been operated in Step S11, in the first type character display area 41 and the second type character display area 42, respectively, which are displayed on the display unit 12.

In Step S13, the control unit 35 determines whether a first key 221 assigned with only a first type character (nonnumeric character) was operated. In a case in which the first key 221 was operated (Yes), the processing advances to Step S14. In a case in which the first key 221 was not operated (No), the determination of Step S13 is performed again.

In Step S14, the control unit 35 displays only the first type character (nonnumeric character) on the display unit 12. In other words, the control unit 35 cancels displaying the second type character display area 42 from the display unit 12, and displays only the first type character display area 41 on the display unit 12.

Here, the control unit 35 may display only the first type character display area 41 on the display unit 12 on condition that the first keys 221 were operated more than a predetermined number of times. It should be noted that the predetermined number of times may be appropriately set by the user.

Next, descriptions are provided regarding the second transition of the display mode of display unit 12 with reference to FIG. 5.

In a state where the initial screen 40 on standby for an incoming telephone call is displayed on the display unit 12 (see FIG. 5A), in a case in which a first key 221 is depressed, the control unit 35 displays a first type character assigned to the depressed first key 221 in the first type character display area 41, and does not display the second type character display area 42 on the display unit 12. For example, as shown in FIG. 5B, in a case in which first keys 221 assigned with "K", "Y", "O" and "U", respectively, are depressed, the control unit 35 displays a hiragana character string with the pronunciation "kyou (today)", which is obtained through Japanese kana conversion of "KYOU", in the first type character display area 41. Japanese character strings with the pronunciation "kyou (today)", "gyoukai (industry)", "Kyoto" and "gyoumu (task)" are displayed in the first type character display area 41 in order to perform predictive conversion of the hiragana character string with the pronunciation "kyou".

It should be noted that, in a state where the first type character display area 41 and the second type character display area 42 are displayed on the display unit 12, in a case in which a first key 221 is depressed, the control unit 35 can display a first type character assigned to the depressed first key 221 in the first type character display area 41, and cancel displaying the second type character display area 42 from the display unit 12.

Next, descriptions are provided regarding the second operation of the cellular telephone device 1 with reference to FIG. 6.

Firstly, in Step S21, the control unit 35 determines whether a first key 221 assigned with only a first type character (nonnumeric character) was operated. In a case in which the first key 221 was operated (Yes), the processing advances to Step S22. In a case in which the first key 221 was not operated (No), determination in Step S21 is performed again.

In Step S22, the control unit 35 displays only the first type character (nonnumeric character) on the display unit 12. In other words, in a state where the initial screen 40 is displayed on the display unit 12, in a case in which the first key 221 is operated, the control unit 35 displays only the first type character display area 41 on the display unit 12, and does not display the second type character display area 42 on the display unit 12. Moreover, in a state where the first type character display area 41 and the second type character display area 42 are displayed on the display unit 12, in a case in which first key 221 is operated, the control unit 35 cancels displaying the second type character display area 42 from the display unit 12, and displays only the first type character display area 41 on the display unit 12.

Here, it is possible for the control unit 35 to display only the first type character display area 41 on the display unit 12 on condition that the first keys 221 were operated more than a predetermined number of times. It should be noted that the predetermined number of times may be appropriately set by the user.

Next, descriptions are provided regarding the third transition of the display mode of display unit 12 with reference to FIG. 7.

In a state where the initial screen 40 on standby for an incoming telephone call is displayed on the display unit 12 (see FIG. 7A), in a case in which a second key 222 is depressed, the control unit 35 displays a first type character assigned to the depressed second key 222 in the first type character display area 41, and displays a second type character assigned to the depressed second key 222 in the second type character display area 42. For example, as shown in FIG. 7B, in a case in which second keys 222 assigned with "R, 0", "Q, 1", "W, 2", "E, 3", "A, 4", "S, 5" and "D, 6", respectively, were depressed, the control unit 35 displays a mixed character string of kana and alphabetic characters represented alphabetically as "r ku e a s d", which is obtained through Japanese kana conversion of an alphabetic character string "RQWEASD", in the first type character display area 41, and displays a numeric character string "0123456" in the second type character display area 42.

In a case in which a character(s) such as the mixed character string "r ku e a s d", for which Japanese kana conversion cannot be performed, is displayed in the first type character display area 41, the control unit 35 cancels displaying the first type character display area 41 and the first type characters (nonnumeric characters), for which Japanese kana conversion cannot be performed, and displays only the second type character display area 42 on the display unit 12. For example, as shown in FIG. 7C, the control unit 35 displays the numeric character string "0123456" in the second type character display area 42.

Next, descriptions are provided regarding the third operation of the cellular telephone device 1 with reference to FIG. 8.

Firstly, in Step S31, the control unit 35 determines whether a second key 222 assigned with a first type character (nonnumeric character) and a second type character (numeric character) was operated. In a case in which the second key 222 was operated (Yes), the processing advances to Step S32. In a case in which the second key 222 was not operated (No), the determination of Step S31 is performed again.

In Step S32, the control unit 35 displays the first type character (nonnumeric character) and the second type character (numeric character) assigned to the second key 222, which was determined to have been operated in Step S31, in the first type character display area 41 and the second type character display area 42, respectively, which are displayed on the display unit 12.

In Step S33, the control unit 35 determines whether a character that cannot be recognized as a character string (an alphabetic character that cannot be converted into a Japanese character) is displayed in the first type character display area 41. In other words, the control unit 35 determines whether a first type character (nonnumeric character) that cannot be converted into a Japanese character is displayed in the first type character display area 41. In a case in which the first type character (nonnumeric character) that cannot be converted into a Japanese character is displayed (Yes), the processing advances in Step S34. In a case in which the first type character (nonnumeric character) that cannot be converted into a Japanese character is not displayed (No), the determination of Step S33 is performed again.

In Step S14, the control unit 35 displays only the second type characters (numeric characters) on the display unit 12. In other words, the control unit 35 cancels displaying the first type character display area 41 from the display unit 12, and displays only the second type character display area 42 on the display unit 12.

Next, descriptions are provided regarding the fourth transition of the display mode of display unit 12 with reference to FIG. 9.

In a state where the initial screen 40 on standby for an incoming telephone call is displayed on the display unit 12 (see FIG. 9A), in a case in which a second key 222 is depressed, the control unit 35 displays a first type character assigned to the depressed second key 222 in the first type character display area 41, and displays a second type character assigned to the depressed second key 222 in the second type character display area 42.

Figure 9A:
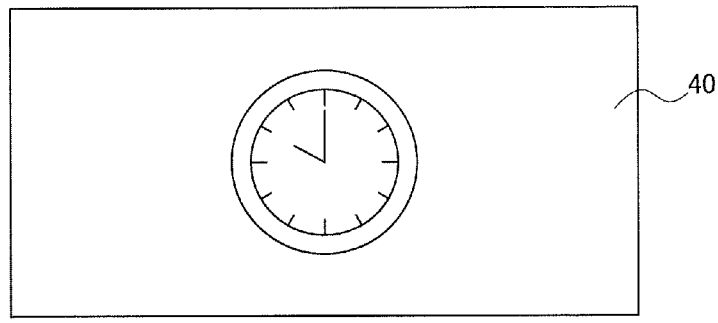
FIG. 9 is a diagram illustrating a fourth transition of the display mode of the display unit.
Figure 9A:
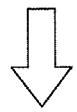
Figure 9B:
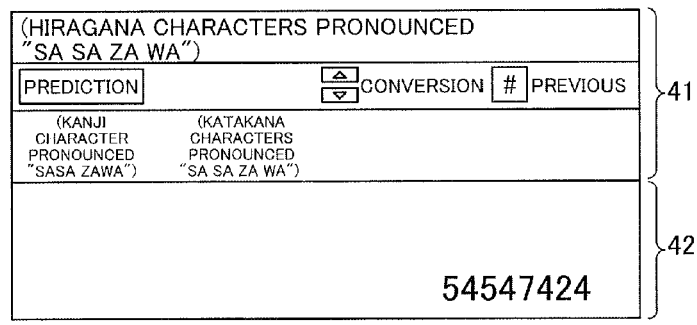
Figure 9B:
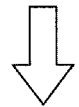
Figure 10:
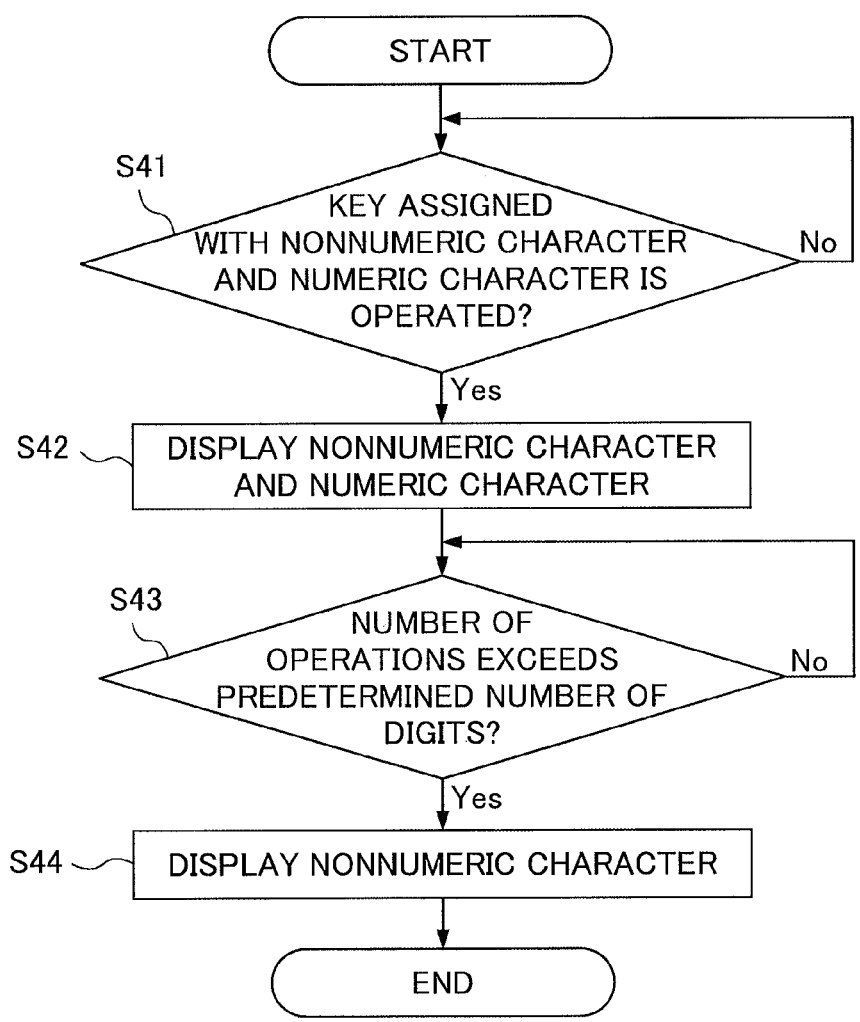
FIG. 10 is a flowchart showing a fourth operation of the cellular telephone device.

For example, as shown in FIG. 9B, in a case in which predetermined second keys 222 are depressed, and Japanese kana conversion is performed, the control unit 35 displays a hiragana character string with the pronunciation "sa sa za wa" in the first type character display area 41, and displays a numeric character string "54547424" in the second type character display area 42. It should be noted that a kanji character string with the pronunciation "sasa zawa" and a katakana character string with the pronunciation "sa sa za wa" are displayed in the first type character display area 41 in order to perform predictive conversion of the hiragana character string with the pronunciation "sa sa za wa".

Subsequently, in a case in which the second keys 222 are consecutively depressed more than a predetermined number of times, and as a result of which the number of digits of the second type characters (numeric characters) displayed in the second type character display area 42 exceeds a predetermined number of digits, the control unit 35 cancels displaying the second type character display area 42 from the display unit 12, and displays only the first type character display area 41 on the display unit 12. It should be noted that the predetermined number of digits may be appropriately set by the user.

Figure 9C:
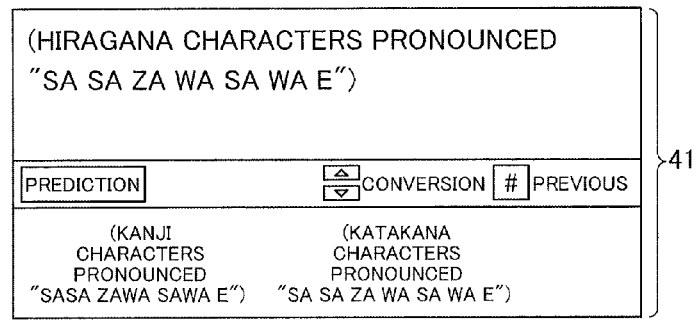

For example, in a case in which the predetermined number of digits is 11 digits, and second keys 222 assigned with "S, 5", "A, 4", "W, 2", "A, 4" and "E, 3", respectively, are further depressed, as shown in FIG. 9C, since the numeric characters displayed in the second type character display area 42 are 13 digits, the control unit 35 displays the first type character display area 41 including a hiragana character string with the pronunciation "sa sa za wa sa wa e" on the display unit 12, and cancels displaying the second type character display area 42 from the display unit 12.

Next, descriptions are provided regarding the fourth operation of the cellular telephone device 1 with reference to FIG. 10.

Firstly, in Step S41, the control unit 35 determines whether a second key 222 assigned with a first type character (nonnumeric character) and a second type character (numeric character) was operated. In a case in which the second key 222 was operated (Yes), the processing advances to Step S42. In a case in which the second key 222 was not operated (No), the determination of Step S41 is performed again.

In Step S42, the control unit 35 displays the first type character (nonnumeric character) and the second type character (numeric character) assigned to the second key 222, which was determined to have been operated in Step S41, in the first type character display area 41 and the second type character display area 42, respectively, which are displayed on the display unit 12.

In Step S43, the control unit 35 determines whether the number of operations has exceeded a predetermined number of digits. In other words, the control unit 35 determines whether the number of the second type characters (numeric characters) displayed in the second type character display area 42 exceeds a predetermined number of digits as a result of depressing the second keys 222 more than a predetermined number of times. In a case in which the number of operations has exceeded the predetermined number of digits (Yes), the processing advances to Step S44. In a case in which the number of operations has not exceeded the predetermined number of digits (No), determination in Step S43 is performed again.

In Step S44, the control unit 35 displays the first type characters (nonnumeric characters) on the display unit 12. In other words, the control unit 35 cancels displaying the second type character display area 42 from the display unit 12, and displays only the first type character display area 41 on the display unit 12.

Second Embodiment

Figure 11:
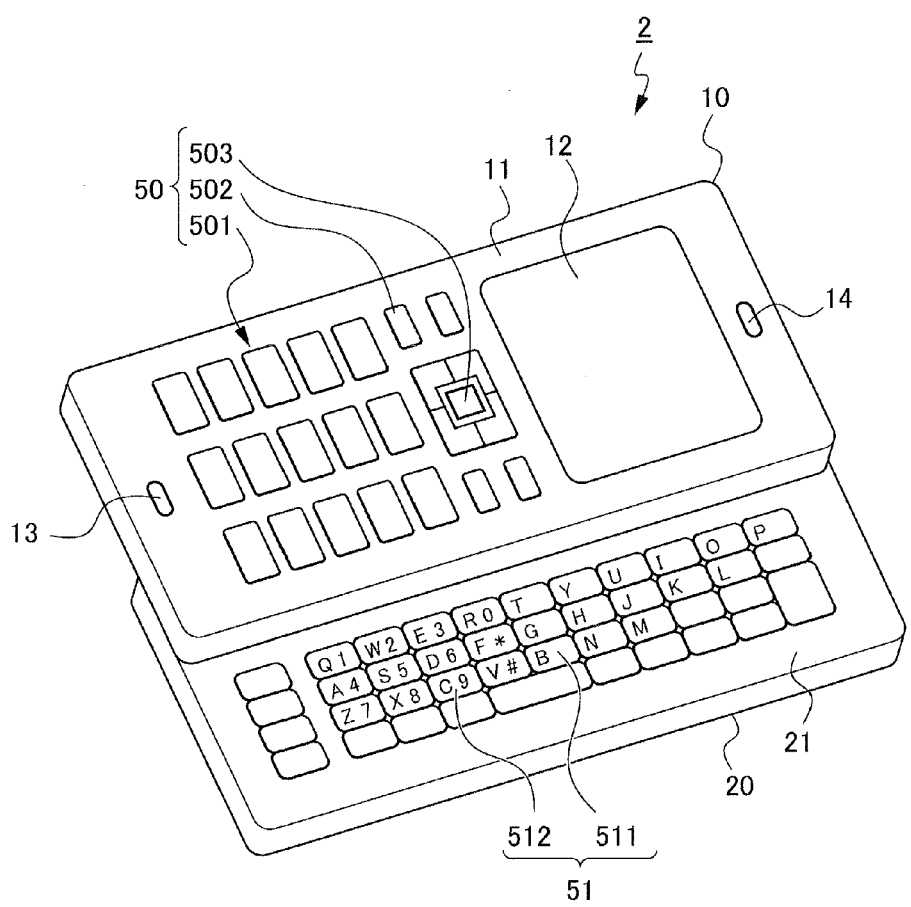
FIG. 11 is an external perspective view of the cellular telephone device as a second embodiment of the portable electronic device.

With reference to FIG. 11, descriptions are provided regarding a basic structure of a cellular telephone device as a second embodiment of the portable electronic device of the present invention.

FIG. 11 is an external perspective view of the cellular telephone device as the second embodiment of the portable electronic device.

A cellular telephone device 2 includes a first body 10 and a second body 20 that are connected so as to be openable and closable.

A display unit 12 and a first operation unit 50 are disposed on a front face 11 of the first body 10.

The display unit 12 displays at least one of first type characters and second type characters in accordance with an operation of the first operation unit 50 or a second operation unit 51 that will be described later. In addition, the display unit 12 displays various types of information (character information, numeric character information, and image information) such as a telephone numbers, email addresses of communication parties, and email content.

The first operation unit 50 is configured to include first keys 501 assigned with the first type characters and the second type characters. Furthermore, the first operation unit 50 includes: function setting operation keys 502 for operating various functions such as respective setting functions, dictionary functions, email functions and the like; and a selection operation key 503 for executing selection in various operations, scrolling and the like. The first operation unit 50 is exposed to the outside of the cellular telephone device 2 in both the closed state and the opened state of the first body 10 and the second body 20.

Moreover, a microphone 13 and a receiver 14 are disposed on the front face 11 of the first body 10. In addition, a speaker 15 (see FIG. 12) is disposed on a side face of the first body 10.

The second operation unit 51 is disposed on a front face 21 of the second body 20. The front face 21 of the second body 20 opposes a rear face of the first body 10 (a face opposite to the front face 11 of the first body 10). The second operation unit 51 is covered by the first body 10 when the first body 10 and second body 20 are in a closed state, and is exposed to the outside when the first body 10 and second body 20 are in an opened state. Therefore, the second operation unit 51 is operational when the first body 10 and the second body 20 slide in relation to each other to transition to the opened state. The second operation unit 51 is configured to include second keys 511 assigned with the first type characters but not second type characters, and third keys 512 assigned with the first type characters and the second type characters.

Figure 12:
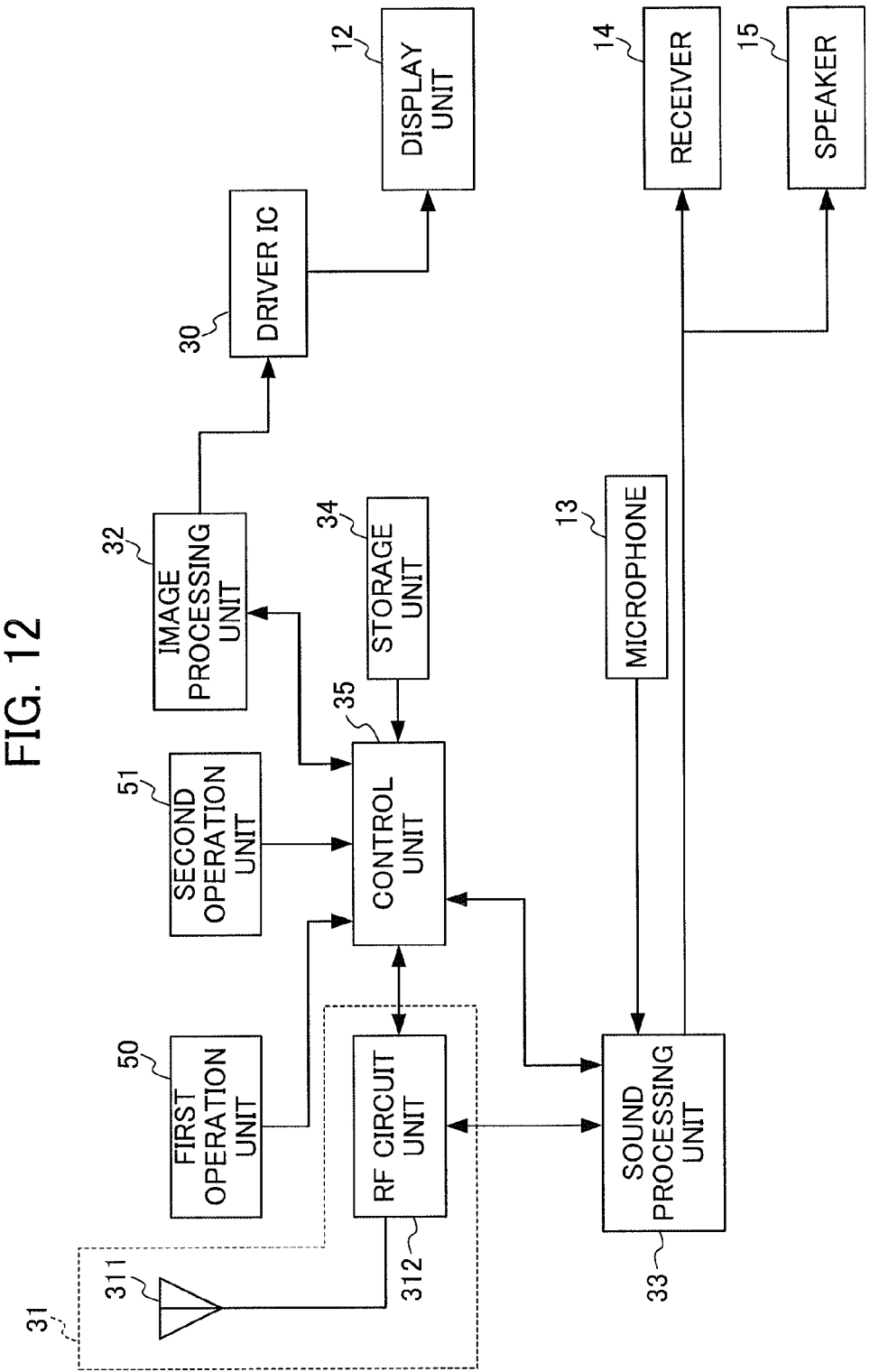
FIG. 12 is a block diagram showing a functional configuration of the cellular telephone device as the second embodiment of the portable electronic device.

Next, descriptions are provided regarding a functional configuration of the cellular telephone device 2 with reference to FIG. 12.

FIG. 12 is a block diagram showing a functional configuration of the cellular telephone device 2. The cellular telephone device 2 includes the first operation unit 50, the second operation unit 51, the microphone 13, the display unit 12, the receiver 14, the speaker 15, a driver IC 30, a communication unit 31, an image processing unit 32, a sound processing unit 33, a storage unit 34, and a control unit 35.

In a state where an initial screen is displayed on the display unit 12, in a case in which any one of the first keys 501 is operated, the control unit 35 displays a second type character assigned to the operated first key 501 on the display unit 12, and in a case in which any one of the second keys 511 or the third keys 512 is operated, the control unit 35 displays a first type character assigned to the second keys 511 or the third keys 512 thus operated on the display unit 12.

Here, the first type characters are nonnumeric characters. Moreover, the second type characters are numeric characters. In addition, the numeric characters as the second type characters include, for example, symbols utilized for an outgoing telephone call such as "# (hash mark)", "* (asterisk)", "- (hyphen)", "P (pause)" and the like.

Furthermore, the control unit 35 controls the entirety of the cellular telephone device 2, and performs predetermined control of the display unit 12, the communication unit 31, the image processing unit 32, and the sound processing unit 33.

Since configurations of the driver IC 30, the communication unit 31, the image processing unit 32, the sound processing unit 33 and the storage unit 34 are similar to the configurations described with reference to FIG. 2, a description thereof is omitted.

As described above, in the first operation unit 50, in a case in which any one of the first keys 501 assigned with the first type characters (nonnumeric characters) and the second type characters (numeric characters) is operated, the cellular telephone device 2 displays a second type character corresponding to the first key 501 on the display unit 12. Moreover, in the second operation unit 51, in a case in which any one of the second keys 511 assigned with only the first type characters or any one of the third keys 512 assigned with the first type characters and the second type characters is operated, the cellular telephone device 2 displays a first type character corresponding to the second key 511 or the third key 512 on the display unit 12. Therefore, the cellular telephone device 2 can make a display that reflects the user's intention.

The invention claimed is:

1. A portable electronic device, comprising:
an operation module that includes a plurality of first keys and a plurality of second keys, wherein each of the plurality of first keys is differently assigned with an alphabetic character being a first type character but not assigned with a numeric character being a second type character, and each of the plurality of second keys is differently assigned with the first type character and the second type character;
a display module configured to display contents, wherein the contents include:
an initial screen being a wallpaper screen on standby for communication, a first type character display area for displaying one or more of the first type characters, and a second type character display area for displaying one or more of the second type characters; and
a control module configured to control the display module, wherein, the control module is configured to:
in response to an operation onto any one of the plurality of first keys in a first state while the display module displays the initial screen, display one or more of the first type character assigned to an operated first key, and
in response to a single operation onto any one of the plurality of second keys in the first state, parallelly display both one or more of the first type characters within the first type character display area and one or more of the second type characters within the second type character display area assigned to an operated second key, and in response to an operation of any one of the plurality of first keys more than a predetermined number of times in a second state, where the display module parallelly displays both of one or more of the first type characters and one or more of the second type characters, displays only the first type character display area with one or more of the first type characters and cancel displaying the second type character area with the displayed second type characters, and in response to a single operation onto any one of the plurality of second keys in the second state where the display module parallelly displays both of one or more of the first type characters and one or more of the second type characters, display only the second type character display area with one or more of the second type characters and cancel displaying the first type character display area when the alphabetic characters cannot be converted into Japanese kana characters.

2. The portable electronic device according to claim 1, further comprising a communication module, wherein the operation module includes a calling key assigned with none of the first type characters and none of the second type characters, and wherein, in a state where the second type characters and first type characters are displayed on the display module as a result of operating any one of the second keys, when the calling key is operated, the control module controls the communication module to make a call to a communication party represented by the second type characters displayed on the display module.

3. The portable electronic device according to claim 1, further comprising:

a first body in which the display module is disposed; and a second body in which the operation module is disposed, the second body configuring an opened state by moving in relation to the first body, or configuring a closed state by being disposed so as to be superimposed on the first body, wherein, when the first body and the second body are in the opened state, when the first type characters and second type characters are displayed on the display module as a result of operating any one of the second keys, in a case in which the control module detects a transition from the opened state to the closed state, the control module cancels displaying the first type characters displayed on the display module.

4. The portable electronic device according to claim 3, wherein, in a case of detecting a transition to the opened state within a predetermined period of time after detecting a transition from the opened state to the closed state, the control module displays the first type characters, whose display has been cancelled, and the second type characters displayed on the display module as a result of operating any one of the second keys on the display module.

5. A display method that is applied to a portable electronic device comprising:

configuring an operation module to include a plurality of first keys differently assigned with alphabetic characters being a first type character but not a numeric character being a second type character, and a plurality of second keys assigned with the first type characters and the second type character; and configuring a control module to control content on a display module in response to an operation of any one or more of the plurality of first keys or the plurality of second keys in a first state and a second state, controlling the display module to display contents including: the first type character within a first type character display area and the second type character within a second type character display area, and an initial screen, the initial screen being a wallpaper screen on standby for communication, and controlling the display module in the first state to display the initial screen on the display module, when any one or more of the first keys is operated, the control module displays the first type character assigned to one or more of the plurality of first keys within the first type character display area thus operated, and controlling the display module in the first state when one or more of the second keys is operated to display both the first type character within the first type character display area and the second type character within the second type character display area assigned to the second key, and in the second state, in which one or more of the first type characters and one or more of the second type characters are both parallelly displayed by the display module, when any one or more of the first keys is operated more than a predetermined number of times, controlling the display module to display only the first type character assigned to the first key, and cancel the display of the second type character display area with the displayed second type characters, and in the second state in which one or more of the first type characters and one or more the second type characters are both parallelly displayed, controlling the display module to display only the second type character display area with one or more of the second type characters and cancel displaying the first type character display area when the alphabetic characters cannot be converted into Japanese kana characters.

6. The portable electronic device according to claim 1, wherein:

the control module is configured to display the first type character string on the display module when the first key is operated on a plurality of occasions, display one first type character when the same first key is continuously operated on a plurality of occasions, display the first type character string and the second type character string respectively on the display module when the second key is operated on a plurality of occasions, and display one first type character and a plurality of second type characters when the same second key is continuously operated on a plurality of occasions.

* * * * *